United States Patent
Kim et al.

(10) Patent No.: US 7,355,252 B2
(45) Date of Patent: Apr. 8, 2008

(54) ELECTROSTATIC DISCHARGE PROTECTION DEVICE AND METHOD OF FABRICATING THE SAME

(75) Inventors: Yong-Don Kim, Suwon-si (KR); Jong-Hwan Oh, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 307 days.

(21) Appl. No.: 10/993,438

(22) Filed: Nov. 22, 2004

(65) Prior Publication Data

US 2007/0241407 A1    Oct. 18, 2007

(30) Foreign Application Priority Data

Dec. 15, 2003  (KR) .................. 10-2003-0091308

(51) Int. Cl.
   *H01L 23/62* (2006.01)
(52) U.S. Cl. .............. 257/360; 257/368; 257/355
(58) Field of Classification Search ................ 257/360, 257/368, 355
   See application file for complete search history.

(56) References Cited

U.S. PATENT DOCUMENTS

2001/0006243 A1   7/2001  Morishita
2004/0021179 A1*  2/2004  Lee et al. .................. 257/368

FOREIGN PATENT DOCUMENTS

| JP | 2001-269345 | 3/2003 |
| JP | 2003-78021 A | 3/2003 |
| KR | 10-2001-0091429 | 10/2001 |
| KR | 10-2000-0048383 | 2/2002 |
| KR | 2002-0015199 | 2/2002 |

OTHER PUBLICATIONS

Ker, Ming-Dou, et al. "Novel ESD Implantation for Sub-Quarter-Micron CMOS Technology with Enhanced Machine-Model ESD Robustness", Proceedings of 9th IPFA 2002, Singapore, pp. 70-74, IEEE (2002).

Ming-Dou Ker et al. Novel ESD Implantation for Sub-Quarter-Micron CMOS Technology with Enhanced, etc . . . 2002 IEEE, pp. 70-74.

* cited by examiner

*Primary Examiner*—Long Pham
(74) *Attorney, Agent, or Firm*—Lee & Morse, P.C.

(57) ABSTRACT

An electrostatic discharge protection device, and a method of fabricating the same, includes a substrate, an n-well formed in the substrate, a p-well formed on the n-well, an NMOS transistor formed on the p-well, the NMOS transistor including a gate electrode, an n+ source and an n+ drain, and a grounded p+ well pick-up formed in the p-well, wherein the n-well is connected to the n+ drain of the NMOS transistor and the n+ source is grounded. The n+ drain and the n-well are connected to decrease a voltage of a trigger and a current density of a surface of the substrate.

13 Claims, 7 Drawing Sheets

ELECTROSTATIC DISCHARGE PROTECTION DEVICE AND METHOD OF FABRICATING THE SAME

BACKGROUND OF THE INVENTION

1. Field of the Invention

The present invention relates to a semiconductor device and a method of fabricating the same. More specifically, the present invention relates to an electrostatic discharge protection device and a method of fabricating the same.

2. Description of the Related Art

An integrated circuit (IC) including a MOS field effect transistor (MOSFET) may be easily damaged by an electrostatic discharge (ESD). An ESD may be delivered to an IC from an input/output (I/O) pin, a power pin, or a pad of another IC, and may attack a junction of a transistor, a dielectric and a unit device.

Various structures of an ESD protection circuit have been developed to protect devices from an ESD. An important role of an ESD protection circuit is to guide the ESD current from an easily attackable circuit to a low-impedance path.

Such an ESD protection circuit may be connected between an I/O and power pins and an internal circuit in parallel, and functions to guide the ESD current to an external region by providing a current path at a low power during an ESD. A representative discharge protection circuit may be categorized into a silicon controlled rectifier (SCR) and an npn bipolar transistor. An SCR instantly discharges an ESD current to a node Vss using a parasitic npnp diode. An npn bipolar transistor discharges an ESD current to a node Vss by an operation of a parasitic npn bipolar transistor of a MOS transistor based on a snap-back phenomenon. Such an ESD protection circuit may use a gate grounded NMOS transistor (ggNMOS) for a structure of the npn bipolar transistor.

FIG. 1 is a circuit diagram of a conventional ESD protection circuit using a ggNMOS transistor. FIG. 2 is a graph illustrating a voltage-current (V-I) characteristic of the ggNMOS transistor of FIG. 1 when an electrostatic current is discharged.

Referring to FIG. 1, an ESD protection circuit 5 is connected in parallel between a pad 1 and an internal circuit 3. A drain of the ggNMOS transistor is electrically connected to a pad 1. A gate, a source and a channel of the transistor are connected to a ground node Vss.

Referring to FIG. 2, when a voltage higher than a trigger voltage Vt is applied to the ggNMOS transistor by an ESD, a break down of the drain junction in the ggNMOS transistor causes a portion of charges to flow in a substrate. The charges make the parasitic npn transistor turned-on to discharge a large amount of ESD current through a low-impedance path to the Vss node instantly. Therefore, the internal circuit 3 is protected from damage.

Three issues may degrade the robustness of an ESD protection device. These issues are an increase of a surface current density during an ESD, a hot-carrier issue and Joule heating. In an effort to solve this problem, a silicide blocking layer may be formed between the gate and the source/drain contact of the ggNMOS. However, such a structure requires that the silicide be separated at an area where the source/drain contact is connected to a gate. Further, such a structure has a disadvantage of increasing an area of the ESD circuit.

FIG. 3 illustrates another conventional semiconductor device for an ESD protection device having an n+ drain surrounded by an n-diffusion layer without increasing a layout area.

Referring to FIG. 3, the ESD protection device is formed at a p-well 12 of a substrate 10 and includes NMOS transistors $T_1$ and $T_2$ connected in series sharing an n+ drain 20. Each NMOS transistor $T_1$ and $T_2$ includes a gate electrode 14. Sources 16 of each of the NMOS transistors $T_1$ and $T_2$ and a p+ guard ring 18 are connected to a node Vss. The n+ drain 20 is electrically connected to a pad 24. The device includes an n-diffusion layer 22 surrounding the n+ drain 20 to overcome an increase of surface current density and a hot carrier issue. The n− diffusion layer 22 includes a space under the n+ drain 20.

The space under the n+ drain 20 has a relatively low breakdown voltage. Therefore, the substrate current is generated through the space when an ESD voltage is applied to the n+ drain 20 and discharged through parasitic npn bipolar transistors $Q_1$ and $Q_2$ in the NMOS transistor to the node Vss. This structure may improve ESD robustness because a current path is separated from a substrate surface and a transistor channel that are relatively weak. However, such a structure is formed through a complicated process because it requires an additional layer for forming the n-diffusion layer 22 having the space under the n+ drain 20.

SUMMARY OF THE INVENTION

The present invention is therefore directed to an electrostatic discharge protection device and a method of fabricating the same, which substantially overcome one or more of the problems due to the limitations and disadvantages of the related art.

It is a feature of an embodiment of the present invention to provide an ESD protection device, and a method of forming the same, having good ESD robustness.

It is another feature of an embodiment of the present invention to provide an ESD protection device, and a method of forming the same, that has increased robustness without increasing an area of the ESD circuit.

It is still another feature of an embodiment of the present invention to provide an ESD protection device, and a method of forming the same, that is capable of being fabricated without requiring additional complicated processes.

At least one of the above and other features and advantages of the present invention may be realized by providing an electrostatic discharge protection device including a substrate, an n-well formed in the substrate, a p-well formed on the n-well, an NMOS transistor formed on the p-well, the NMOS transistor including a gate electrode, an n+ source and an n+ drain, and a grounded p+ well pick-up formed in the p-well, wherein the n-well is connected to the n+ drain of the NMOS transistor and the n+ source is grounded.

The gate electrode may be grounded. The gate electrode may be electrically connected to the n+ drain.

An impurity concentration of the n+ drain may be higher than that of the n+ source. The n-well may extend vertically under the n+ drain and may contact the n+ drain. The n-well may extend vertically to form a junction with the p-well and a junction of the n-well and the p-well may overlap the n+ drain.

At least one of the above and other features and advantages of the present invention may be realized by providing an electrostatic discharge protection device including a p-well region formed in a substrate, an NMOS transistor formed on the p-well region, the NMOS transistor including a gate electrode and an n+ source that are electrically connected to a ground terminal and an n+ drain electrically connected to a circuit terminal, a p+ well pick-up formed in the p-well region, electrically connected to the ground terminal, and an n-well formed under the p-well region, wherein the n-well extends vertically to contact the n+ drain of the NMOS transistor.

The electrostatic discharge protection device may further include an interconnection connected to the ground terminal, wherein the n+ source, the gate electrode and the p+ well pick-up may be connected to the interconnection in parallel.

At least one of the above and other features and advantages of the present invention may be realized by providing an electrostatic discharge protection device connected to a circuit terminal and a ground terminal including a p-well region formed in a substrate, an NMOS transistor formed on the p-well region, the NMOS transistor including a gate electrode electrically connected to the circuit terminal, an n+ source electrically connected to the ground terminal and an n+ drain electrically connected to the circuit terminal, a p+ well pick-up formed in the p-well region to be electrically connected to the ground terminal, and an n-well formed under the p-well region, wherein the n-well extends vertically to contact the n+ drain of the NMOS transistor.

The electrostatic discharge protection device may further include a first interconnection connected to the ground terminal, wherein the n+ source and the p+ well pick-up are connected to the first interconnection in parallel. The electrostatic discharge protection device may further include a second interconnection for connecting the circuit terminal and the n+ drain, wherein the gate electrode is an extended portion of the second interconnection.

At least one of the above and other features and advantages of the present invention may be realized by providing a method of fabricating the electrostatic discharge protection device including forming a p-well region at an upper portion of a substrate and an n-well region under the p-well region, wherein the n-well region extends vertically along a sidewall of the p-well region to define a junction between the p-well region and the n-well region at a surface of the substrate, forming an n+ source and an n+ drain separated from each other by implanting impurities in the p-well region, wherein the n+ drain is formed to overlap the junction of the p-well region and the n-well region, forming a p+ well pick-up by implanting impurities in the p-well region, and forming an interconnection connected to each of the p+ well pick-up, the n+ source and the n+ drain, wherein the p+ well pick-up and the n+ source are connected to a ground terminal, and the n+ drain is connected to a circuit terminal.

The method may further include forming a device isolation layer in the substrate to define an active region, before forming the n-well region and the p-well region, wherein the active region includes the n-well region and the p-well region, and the n+ source, the p+ well pick-up and the n+ drain are formed in the active region.

The method may further include forming a device isolation layer in the substrate to define an active region, after forming the n-well region and the p-well region, wherein the active region includes the n-well region and the p-well region, and the n+ source, the p+ well pick up and the n+ drain are formed in the active region.

An interconnection connected to the n+ drain may extend over a region between the n+ source and the n+ drain, such that an edge of the interconnection overlaps the n+ source.

At least one of the above and other features and advantages of the present invention may be realized by providing a method of fabricating an electrostatic discharge protection device connected to a circuit terminal and a ground terminal including forming a p-well region at an upper portion of a substrate and an n-well region under the p-well region, wherein the n-well region extends vertically along a sidewall of the p-well region to define a junction of the p-well region and the n-well region at a surface of the substrate, forming a gate electrode on the p-well region, implanting impurities in the substrate at either side of the gate electrode to form an n+ source and an n+ drain, wherein the n+ drain is formed to overlap a junction between the p-well region and the n-well region, implanting impurities in the p-well region to form a p+ well pick-up, and forming an interconnection connecting each of the p+ well pick-up, the gate electrode, the n+ source and the n+ drain, wherein the p+ well pick-up and the n+ source are connected to the ground terminal, and the n+ drain is connected to the circuit terminal.

The method may further include forming a device isolation layer in the substrate to define an active region, before forming the n-well region and the p-well region, wherein the active region includes the n-well region and the p-well region, the gate electrode crosses over the p-well region in the active region, and wherein the active region at one side of the gate electrode includes the p-well region and the active region at the other side of the gate electrode includes the p-well region and the n-well region.

The method may further include forming a device isolation layer in the substrate to define an active region, after forming the n-well region and the p-well region, wherein the active region includes the n-well region and the p-well region, and wherein the gate electrode crosses over the p-well region in the active region, and the active region at one side of the gate electrode is the p-well region and the active region at the other side includes the p-well region and the n-well region.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Figure 1:
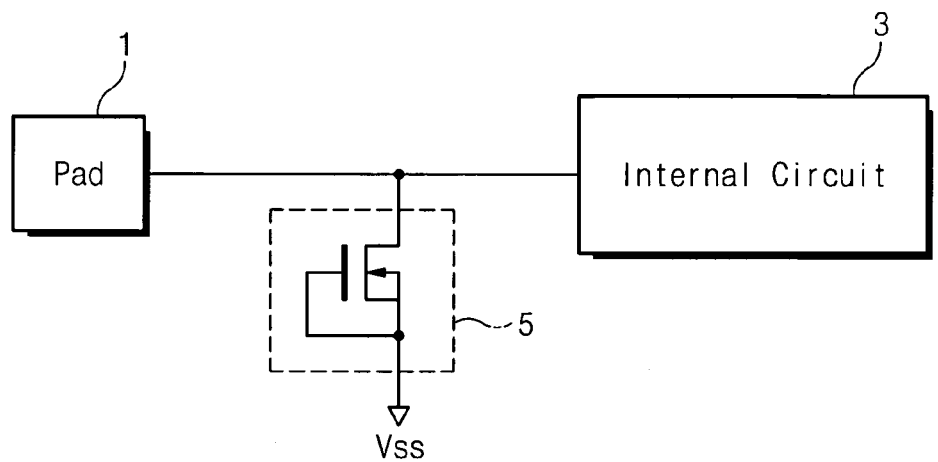
FIG. 1 is a circuit diagram of an ESD protection circuit using a ggNMOS transistor.
Figure 2:
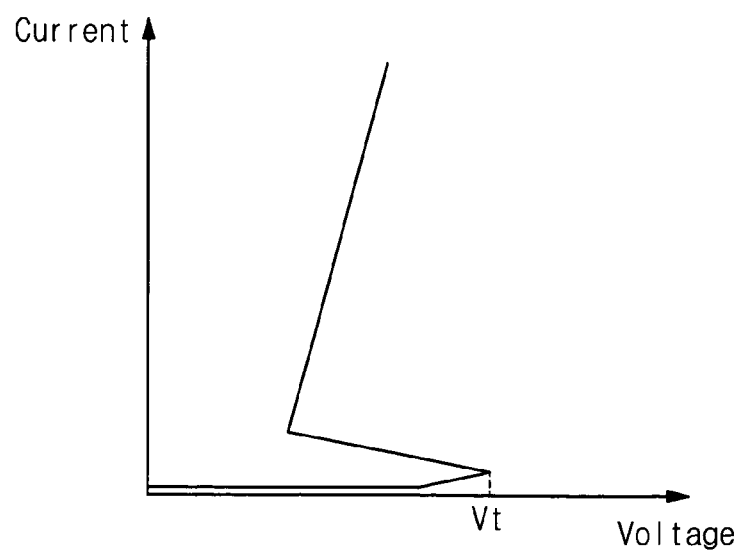
FIG. 2 is a graph illustrating a voltage-current (V-I) characteristic of the ggNMOS transistor of FIG. 1 when an electrostatic current is discharged.
Figure 3:
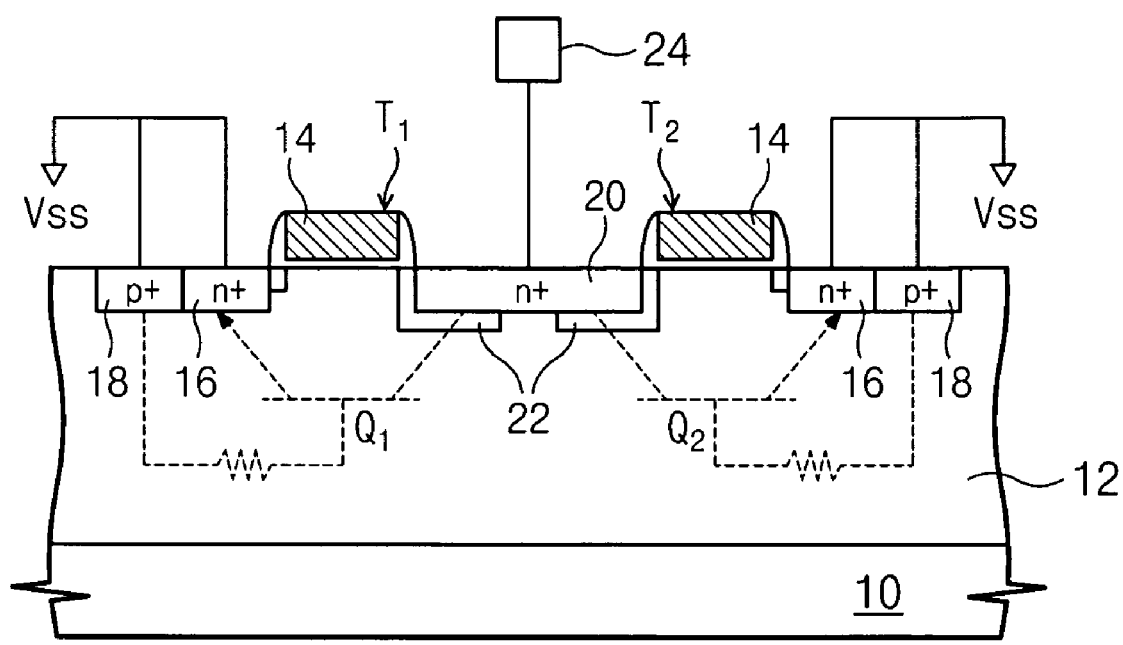
FIG. 3 illustrates another conventional semiconductor device for an ESD protection device.

Korean Patent Application 2003-91308, filed on Dec. 15, 2003, in the Korean Intellectual Property Office, and entitled: "Electrostatic Discharge Protection Device and Method of Fabricating the Same," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the figures, the dimensions of films, layers and regions are exaggerated for clarity of illustration. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 4A:
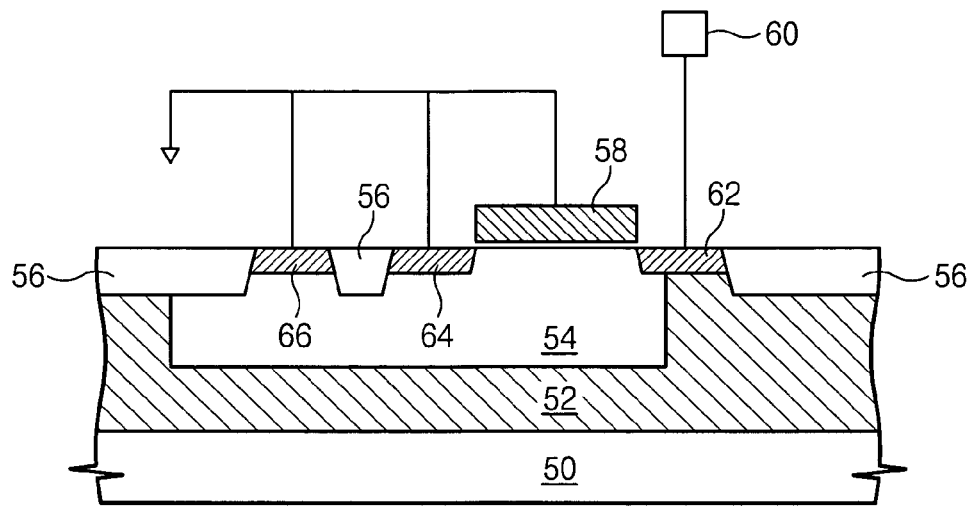
FIG. 4A illustrates a cross-sectional view of an ESD protection device according to a first embodiment of the present invention.

FIG. 4A illustrates a cross-sectional view of an ESD protection device according to the first embodiment of the present invention.

Referring to FIG. 4A, the ESD protection device includes an n-well 52 formed in a substrate 50 and a p-well 54 formed on the n-well 52. The p-well 54 extends to a surface of the substrate 50. The n-well 52 includes a portion that extends vertically along a sidewall of the p-well 54 to a surface of the substrate 50. A device isolation layer 56 is formed in the substrate 50 to define an active region. The active region includes a region where the p-well 54 is formed (hereinafter, referred to as a 'p-well region') and a region where the n-well 52 is formed (hereinafter, referred to as an 'n-well region'). A gate electrode 58 is formed on the active region. The gate electrode 58 crosses over the active region and, although not illustrated as doing so, may extend over the device isolation layer 56. The gate electrode 58 divides the active region into a first portion of the active at one side of the gate electrode 58 that includes the p-well region and the n-well region and a second portion of the active region to the other side of the gate electrode 58 that includes the p-well region. An n+ source 64 and an n+ drain 62 are formed in the active regions to either side of the gate electrode 58. The gate electrode 58, the n+ source 64 and the n+ drain 62 compose an NMOS transistor. The n+ source 64 is formed in the p-well 54, and the n+ drain 62 is formed to overlap the p-well 54 and the n-well 52.

Conventionally, a source and a drain of the NMOS transistor are formed in the p-well or a p-substrate, but the n+ drain 62 of the NMOS transistor in the ESD protection device according to the present invention overlaps the p-well 54 and the n-well 52 and contacts the n-well 52. An impurity concentration of the n+ drain 62 may be higher than that of the n+ source 64 due to an influence of the n-well 52.

A p+ well pick-up 66 doped with impurities is formed in the p-well region 54. The p+ well pick-up 66 may be separated from the NMOS transistor by the device isolation layer 56. The n+ drain 62 is connected to a circuit terminal 60 of the integrated circuit. The n+ source 64 and the p+ well pick-up 66 are connected to a ground terminal. The circuit terminal 60 may be an input/output (I/O) pin, a data pin or a power pin, and may be electrically connected to an internal circuit. The gate electrode 58 functions to separate the n+ source 64 from the n+ drain 62 to form a base of a parasitic npn bipolar transistor. However, the gate electrode 58 may be connected to a ground terminal to prevent the NMOS transistor from operating abnormally due to a voltage drop of the p-well 54 as a result of an ESD protection current.

The NMOS transistor may adopt a gate electrode in a finger structure to discharge a large amount of current even though a representative singular gate electrode is illustrated in FIG. 4A. In this case, the n-well 52 vertically extends to connect to the n+ drain 62. In addition, the p+ well pick-up 66 may be formed in the p-well 54 as a guard ring type that surrounds the ESD protection circuit.

Figure 4B:
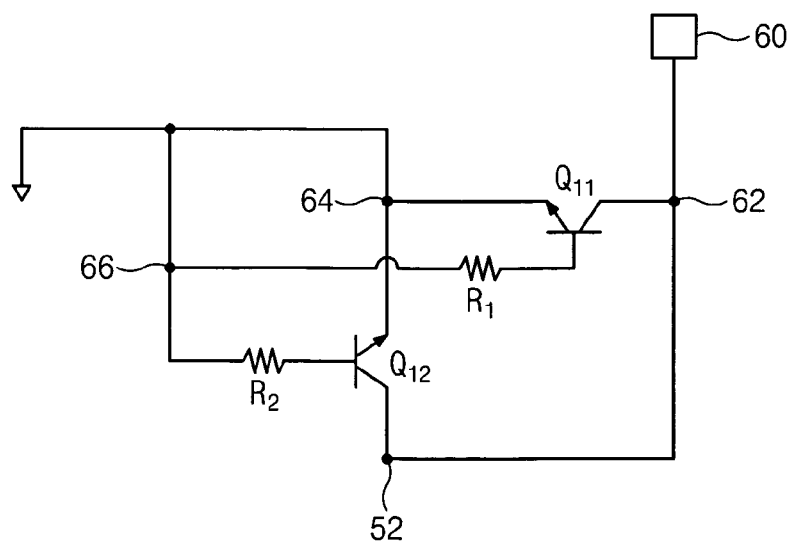
FIG. 4B is an equivalent circuit diagram of an ESD protection device according to the first embodiment of the present invention.

FIG. 4B is an equivalent circuit diagram of an ESD protection device according to the first embodiment of the present invention.

The ESD protection device operates using a parallel circuit of a parasitic npn bipolar transistor in the NMOS transistor. The n+ source 64, the n+ drain 62 and the p-well 54 correspond to an emitter, a collector and a base, respectively, of the first npn bipolar transistor $Q_{11}$. The n+ source 64, the n-well 52 and the p-well 54 correspond to an emitter, a collector and a base, respectively, of the second npn bipolar transistor $Q_{12}$.

When an ESD voltage is applied to the n+ drain 62 to break down a junction among the n+ drain 62, the n-well 52 and the p-well 54, the first and second npn bipolar transistors $Q_{11}$ and $Q_{12}$ are triggered. A voltage drop by the parasitic resistors $R_1$ and $R_2$ of the p-well 54 drives the first and second npn bipolar transistors $Q_{11}$ and $Q_{12}$ to instantly discharge the ESD current through a ground terminal. The ESD protection device discharges the ESD current by operation of a lateral npn bipolar transistor $Q_{11}$ and a vertical npn bipolar transistor $Q_{12}$. The lateral npn bipolar transistor $Q_{11}$ includes the n+ source 64, the n+ drain 62 and the p-well 54. The vertical npn bipolar transistor $Q_{12}$ includes the n+ source 64, the n-well 52 and the p-well 54. Therefore, a discharge current is dispersed to lower a surface current of the substrate and suppress Joule heat generated from a surface of the substrate.

The impurities of the n-well 52 may raise an impurity concentration of the n+ drain 62. Therefore, a junction breakdown voltage between the n+ drain 62 and the p-well 54 can be reduced to provide a low trigger voltage for the bipolar transistor. In this case, an impurity concentration of the n+ drain 62 is highest at a portion where the p-well 54, the n-well 52 and the n+ drain 62 contact one another. Therefore, this portion breaks down first to lower a current density of the surface at the region adjacent a gate.

Figure 5A:
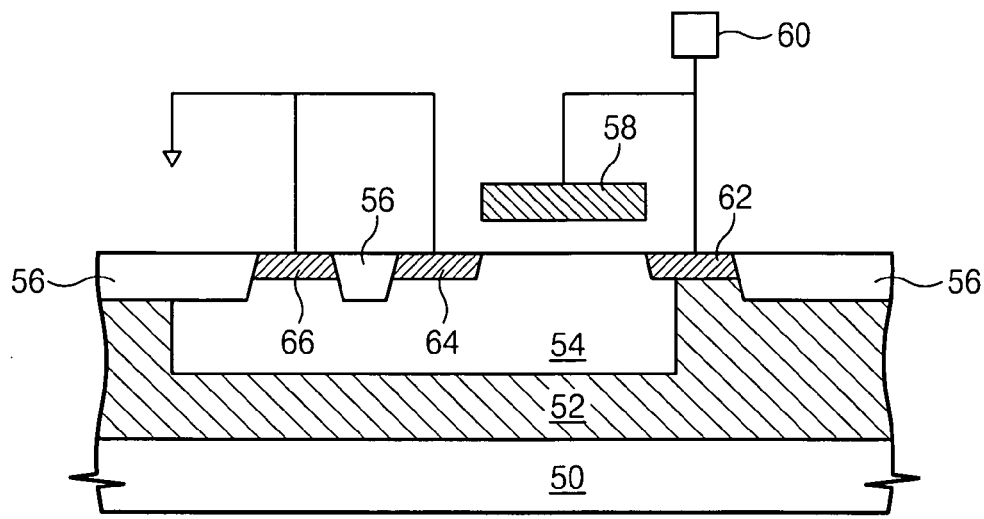
FIG. 5A illustrates a cross-sectional view of an ESD protection device according to a second embodiment of the present invention.

FIG. 5A illustrates a cross-sectional view of an ESD protection device according to the second embodiment of the present invention.

Referring to FIG. 5A, the ESD protection device similarly includes an NMOS transistor having the n+ drain 62 connected to the n-well 52. The n-well 52 and the p-well 54 are formed in the substrate 50. The p-well 54 extends to a surface of the substrate 50. A portion of the n-well 52 vertically extends along a sidewall of the p-well 54 to a surface of the substrate 50. The device isolation layer 56 is formed in the substrate 50 to define an active region. The active region includes the p-well region and the n-well region. The gate electrode 58 is formed on the active region. The gate electrode 58 crosses over the active region and, although not illustrated as doing so, may extend to a surface of the device isolation layer 56. The gate electrode 58 divides the active region into a first portion of the active at one side of the gate electrode 58 that includes the p-well region and the n-well region and a second portion of the active region to the other side of the gate electrode 58 that includes only the p-well region. The n+ source 64 and the n+ drain 62 are formed in the active regions to either side of the gate electrode 58. The gate electrode 58, the n+ source 64 and the n+ drain 62 compose an NMOS transistor. In the second embodiment of the present invention, a dielectric layer (not shown in FIG. 5A; 224 of FIG. 11), which may be thick, is interposed between the gate electrode 58 and the active region. The n+ source 64 is formed in the p-well 54, and the n+ drain 62 is formed to overlap the p-well 54 and the n-well 52. Therefore, a drain of the NMOS transistor in the ESD protection device includes a drain 62 overlapping the p-well 54 and the n-well 52 to contact the n-well 52. The n+ drain 62 may have an impurity concentration higher than that of the n+ source 64 due to an influence of the n-well 52.

A p+ well pick-up 66 doped with impurities is formed in the p-well 54. The p+ well pick-up 66 may be separated from the NMOS transistor by the device isolation layer 56. The n+ drain 62 is connected to a circuit terminal 60 of the integrated circuit. In the second embodiment of the present invention, the n+ source 64 and the p+ well pick-up 66 are connected to a ground terminal, and the gate electrode 58 and the n+ drain 62 are connected to the circuit terminal 60. A threshold voltage of the NMOS transistor may be high to maintain the NMOS transistor of the ESD protection device at turn-off at a steady state. Therefore, the insulating layer is interposed between the gate electrode 58 and the active region. The gate electrode 58 may be an extended portion of an interconnection, which will be described below, connected to the n+ drain 62. In this case, the interlayer dielectric layer may correspond to a gate insulation layer.

Although a representative singular gate electrode is illustrated in FIG. 5A, the NMOS transistor may adopt a gate electrode in a finger structure to discharge a large amount of current. In this case, the n-well 52 vertically extends to connect to the n+ drain 62. In addition, the p+ well pick-up 66 may be formed in the p-well 54 as a guard ring type surrounding the ESD protection circuit.

Figure 5B:
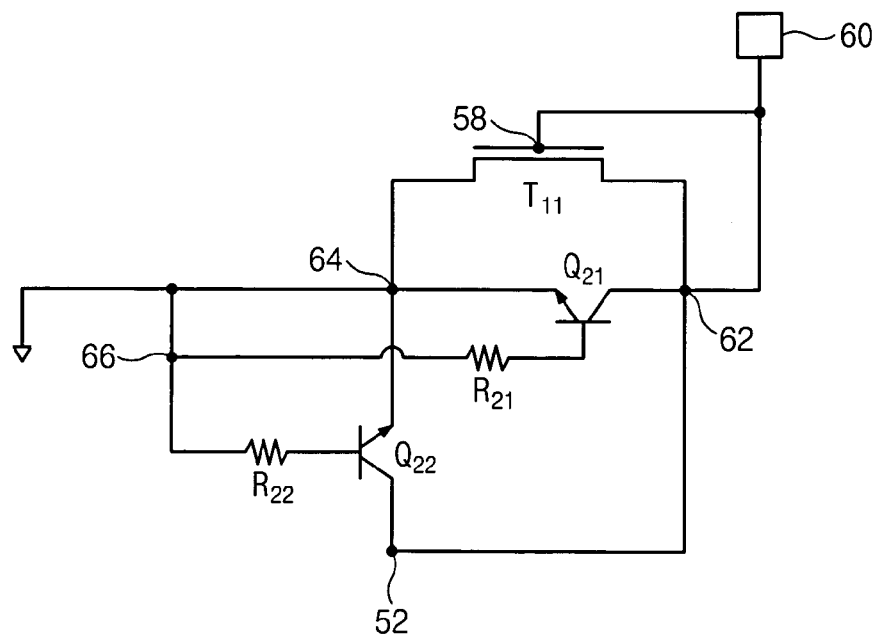
FIG. 5B is an equivalent circuit diagram of an ESD protection device according to the second embodiment of the present invention.

FIG. 5B is an equivalent circuit diagram of the ESD protection device according to the second embodiment of the present invention.

Referring to FIG. 5B, the ESD protection device operates using an NMOS transistor $T_{11}$ and parasitic npn bipolar transistors $Q_{21}$ and $Q_{22}$ in the NMOS transistor $T_{11}$. The n+ source 64, the n+ drain 62 and the p-well 54 correspond to an emitter, a collector and a base, respectively, of the first npn bipolar transistor $Q_{21}$. The n+ source 64, the n-well 52 and the p-well 54 correspond to an emitter, a collector and a base, respectively, of the second npn bipolar transistor $Q_{22}$.

When a junction among the n+ drain 62, the n-well 52 and the p-well 54 breaks down due to application of an ESD voltage to the n+ drain 62, the first and second npn bipolar transistors $Q_{21}$ and $Q_{22}$ are triggered. The first and second npn bipolar transistors $Q_{21}$ and $Q_{22}$ are driven by a voltage drop due to parasitic resistances $R_{21}$ and $R_{22}$ of the p-well 54, such that an ESD current is instantly discharged to a ground terminal. The ESD protection device discharges ESD current by operation of a lateral npn bipolar transistor $Q_{21}$, a vertical npn bipolar transistor $Q_{22}$ and the NMOS transistor $T_{11}$. The lateral npn bipolar transistor $Q_{21}$ includes the n+ source 64, the n+ drain 62 and the p-well 54. The vertical npn bipolar transistor $Q_{22}$ includes the n+ source 64, the n-well 52 and the p-well 54. That is, the transistors are triggered at the lowest one of a junction breakdown voltage between the n+ drain 62 and the p-well 54, a junction breakdown voltage between the n-well 52 and the p-well 54, and a threshold voltage of the NMOS transistor $T_{11}$, thereby instantly discharging the ESD current.

Figure 6:
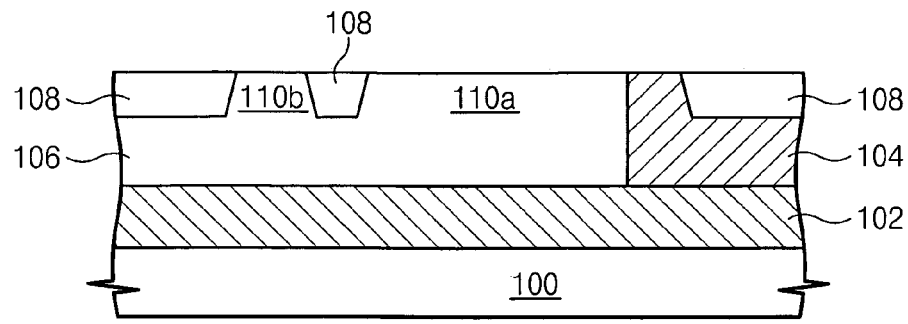
FIGS. 6 through 8 illustrate cross-sectional views of stages in a method of fabricating an ESD protection device according to the first embodiment of the present invention.
Figure 7:
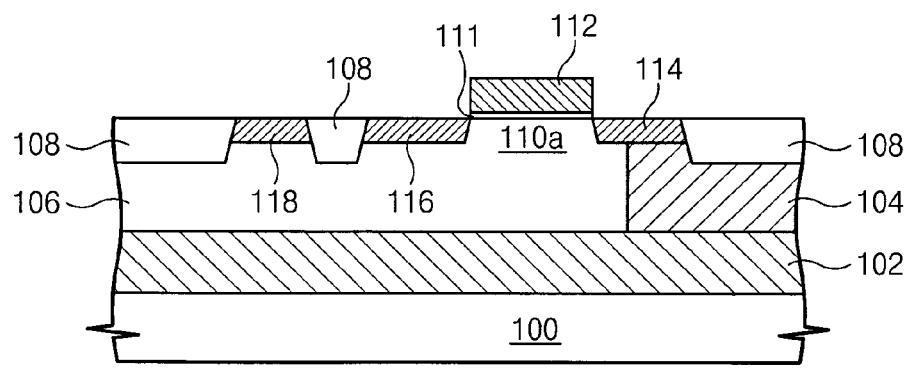
Figure 8:
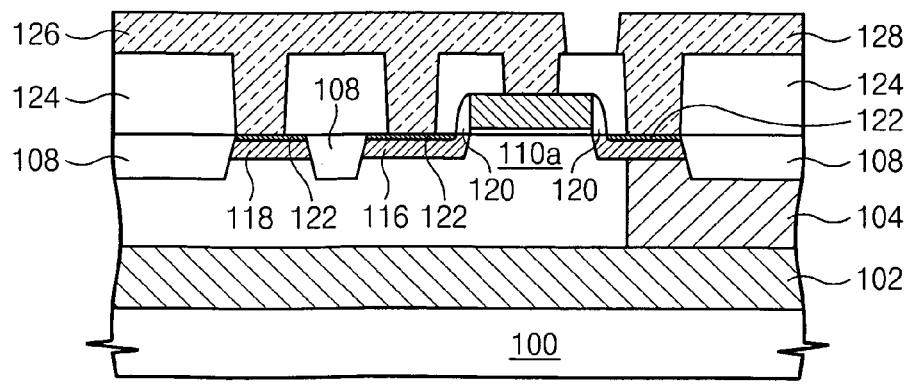

FIGS. 6 through 8 illustrate cross-sectional views of stages in a method of forming the ESD protection device according to the first embodiment of the present invention.

Referring to FIG. 6, a deep n-well 102 is formed by implanting impurities in a substrate 100. A vertical n-well 104 is formed by implanting impurities in the substrate 100. The deep n-well 102 is separated a predetermined distance apart from a surface of the substrate. The vertical n-well 104 is connected to the deep n-well 102 and extends vertically to the surface of the substrate 100.

A CMOS integrated circuit may have various well structures. For example, the integrated circuit may include a p-well where an NMOS transistor is formed, an n-well where a PMOS transistor is formed and a pocket p-well for a well biasing and a well isolation, etc. Therefore, the deep n-well 102 and the vertical n-well 104 may be formed without additional processes by changing an existing layout. A device isolation layer 108 may be formed before forming the wells. A first active region 110a is a region where the NMOS transistor of the ESD protection device is to be formed. A second active region 110b is a region where a well pick-up is to be formed. In an alternative configuration, the second active region 110b may be omitted and the well pick-up may be formed in the first active region 110a. A surface of the first active region 110a includes a p-well region where a p-well 106 is formed and an n-well region where the vertical n-well 104 is formed.

Referring to FIG. 7, a gate electrode 112 is formed on the first active region 110a. A gate insulating layer 111 is interposed between the gate electrode 112 and the first active region 110a. The gate electrode 112 crosses over the first active region 110a extends over the device isolation layer 108. The gate electrode 112 divides the first active region 110a into two portions. The first active region 110a at one side of the gate electrode 112 is a p-well region, and the first active region 110a at another side of the gate electrode 112 includes the p-well region and the n-well region. An n+ source 116 and an n+ drain 114 are formed to either side of the gate electrode 112 by implanting impurities in the first active region 110a. The n+ source 116 is formed in the p-well region, and the n+ drain 1 14 is formed to overlap the p-well region and the n-well region. Therefore, the n+ drain 114 is connected to the vertical n-well 104. Impurities are implanted in the p-well region to form a p+ well pick-up 118. The p+ well pick-up 118 is formed in the second active region 110b,as described above, the second active region 110b is not formed, the p+ well pick-up 118 may be formed to have a guard ring shape surrounding the ESD protection device. By adopting a guard ring structure, an ESD current flowing through the p-well 106 is concentrated in one direction, such that an increase of the current density may be prevented.

The p+ well pick-up 118, the n+ source 116 and the n+ drain 114 may be formed during a formation of a diffusion layer in an internal circuit. Therefore, a formation order may be varied according to an order of forming the internal circuit.

Referring to FIG. 8, an interlayer dielectric layer 124 is formed on an entire surface of the substrate. The interlayer dielectric layer 124 is patterned to form contact holes exposing each of the p+ well pick-up 118, the n+ source 116, the n+ drain 114 and the gate electrode 112. Although not illustrated in FIG. 8, the contact hole exposing the gate electrode 112 may be placed over the device isolation layer 108. That is, the contact hole exposing the gate electrode 112 may be formed over the portion of gate electrode 112 extending over the device isolation layer 108.

An interconnection, including a first interconnection 126 and a second interconnection 128, is then formed on the interlayer dielectric layer 124. The first interconnection 126 extends through one of the contact holes to contact the n+ source 116. The second interconnection 128 extends through one of the contact holes to contact the n+ drain 114. The first interconnection 126 may extend through another of the contact holes to contact the gate electrode 112. In the drawing, the first interconnection 126 and the second interconnection 128 are illustrated as a single layer, but the first and second interconnection 126 and 128 may have a multi-layered structure. That is, local interconnections may be formed on the interlayer dielectric layer 124 and then another interlayer dielectric layer may be further formed on the local interconnections, such that global interconnections may be formed to connect the local interconnections. The local interconnections and the global interconnections may be formed using conventional multiple interconnections technology.

A silicide layer 122 may be further formed on surfaces of the n+ source 116, the n+ drain 114 and the p+ well pick-up 118 before forming the interlayer dielectric layer 124. An additional silicide layer (not shown) may be formed on a top surface of the gate electrode 112. The silicide layer 122 may be formed by applying a conventional self-aligned silicidation process. A spacer pattern 120 may prevent a short of the silicide layer 122 and the gate electrode 112 and also form a ballast resistance between the silicide layer and the junction. Even if the silicide layer 122 is not formed, the spacer pattern 120 may be collectively formed in an integrated circuit device to junction engineer the internal circuit.

Although not illustrated in the drawings, the first interconnection 126 is connected to a ground terminal, and the second interconnection 128 is connected to a circuit terminal analogous to that shown in FIG. 4A.

Figure 9:
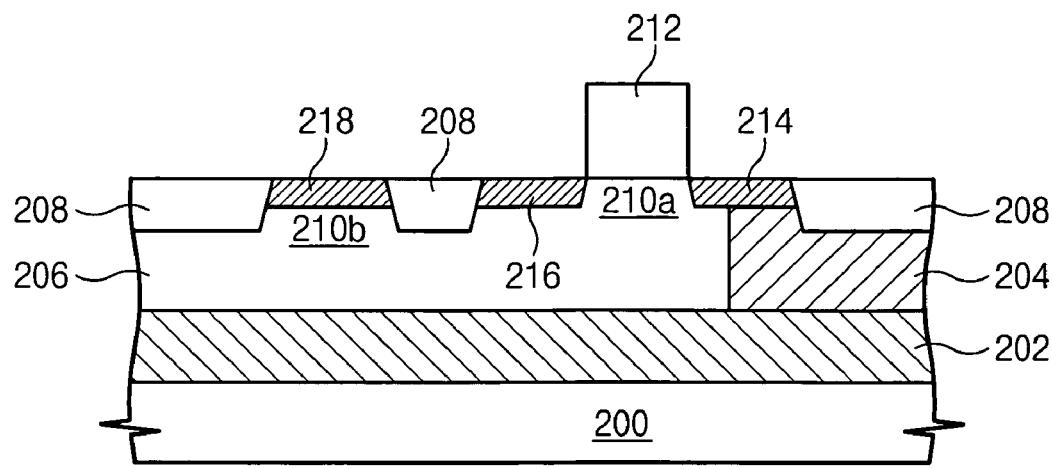
FIGS. 9 through 11 illustrate cross-sectional views of stages in a method of fabricating an ESD protection device according to the second embodiment of the present invention.
Figure 10:
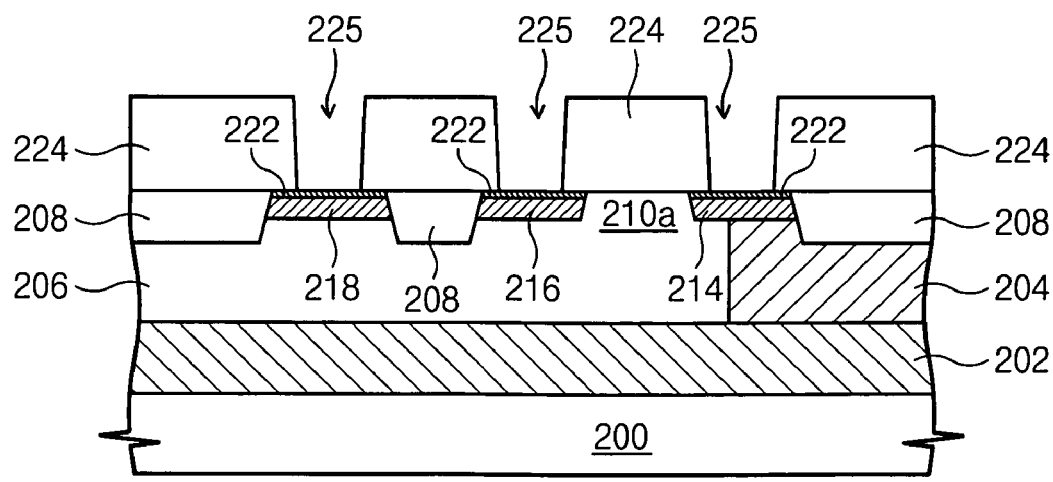
Figure 11:
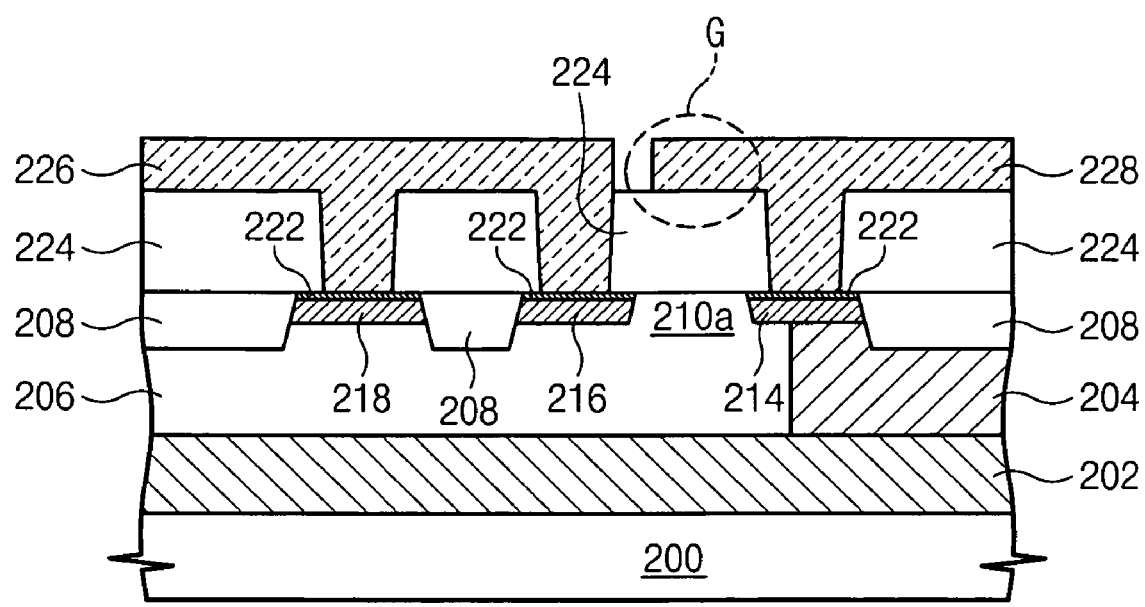

FIGS. 9 through 11 illustrate cross-sectional views of stages in a method of fabricating an ESD protection device according to the second embodiment of the present invention.

Referring to FIG. 9, a deep n-well 202 is formed by implanting impurities into a substrate 200. A vertical n-well 204 is formed by implanting impurities in the substrate. The deep n-well 202 is separated a predetermined distance apart from a surface of the substrate 200. The vertical n-well 204 is connected to the deep n-well 202 and vertically extends to a surface of the substrate 200. The deep n-well 202 and the vertical n-well 204 may be formed without an additional process by changing a conventional layout.

A p-well 206 is formed by implanting impurities in the substrate 200 on the deep n-well 202. A device isolation layer 208 is formed in the substrate 200 including the wells to define the first active region 210a and the second active region 210b. The device isolation layer 208 may be formed before forming the wells. The second active region 210b is a region where the well pick-up is to be formed. If the well pick-up is formed in the first active region 210a, the second active region 201b may not be formed. A surface of the first active region 210a includes a p-well region where the p-well 206 is formed, and an n-well region where the vertical n-well 204 is formed.

A dummy gate pattern 212 is formed on the active region 210a. The dummy gate pattern 212 crosses over the first active region 210a and a portion thereof extends over the device isolation layer 208. A portion of the first active region 210a at one side of the dummy gate pattern 212 is a p-well region, and another portion of the first active region 210a at another side of the dummy gate pattern 212 includes the p-well region and the n-well region. Impurities are implanted in the first active region 210a such that an n+ source 216 and an n+ drain 214 are formed to either side of the dummy gate pattern 212. The n+ source 216 is formed in the p-well region, and the n+ drain 214 is formed overlapping the p-well region and the n-well region. Therefore, the n+ drain 214 is connected to the vertical n-well 204. Impurities are implanted in the p-well region to form a p+ well pick-up 218. The p+ well pick-up 218 is formed in the second active region 210b. If the second active region 210b is not formed, as described above, the p+ well pick-up 218 may be formed in the first active region 210a. The p+ well pick-up 218 may be formed to have a guard ring shape surrounding the ESD protection device. By adopting the guard ring structure, ESD current flowing through the p-well 206 is concentrated in one direction to prevent the current density from increasing.

The p+ well pick-up 218, the n+ source 216 and the n+ drain 214 may be formed when an impurity diffusion layer of the internal circuit is formed. Thus, an order of forming those elements may be varied according to an order of forming an internal circuit.

Referring to FIG. 10, an interlayer dielectric layer 224 is formed on an entire surface of the internal circuit. The interlayer dielectric layer 224 is patterned to form contract holes 225 exposing each of the p+ well pick-up 218, the n+ source 216 and the n+ drain 214. The dummy gate pattern 212 may be removed before forming the interlayer dielectric layer 224. If the dummy gate pattern 212 is an insulating layer, an interlayer dielectric layer 224 may be formed on the dummy gate pattern 212 and then planarized.

Before the interlayer dielectric layer 224 is formed, a silicide layer 222 may be further formed on a surface of the n+ source 216, the n+ drain 214 and the p+ well pick-up 218. In this case, a silicide layer may not be formed at the region between the n+ source 216 and the n+ drain 214 because of the dummy gate pattern 212. The dummy gate pattern 212 may then be removed after the silicide layer 222 is removed.

Referring to FIG. 11, an interconnection, which includes a first interconnection 226 and a second interconnection 228, is formed on the interlayer dielectric layer 224. The first interconnection 226 extends through the contact holes 225 to connect to the p+ well 218 and the n+ source 216. The second interconnection 228 extends through one of the contact holes 225 to connect to the n+ drain 214. The second interconnection 228 may extend over the region between the n+ source 216 and the n+ drain 214. In this case, one sidewall of the second interconnection 228 may overlap the n+ source 216. If a voltage over a predetermined level is applied to the second interconnection 228, a channel may be formed at the first active region 210a between the n+ source 216 and the n+ drain 214. That is, an extended portion G of the second interconnection 228, the n+ source 216 and the n+ drain 214 may compose a MOS transistor. In this case, the interlayer dielectric layer 224 between the extended portion G and the first active region 210a may correspond to a gate interlayer dielectric layer of the MOS transistor. In FIG. 11, the first and second interconnections 226 and 228 are illustrated as a single layer, but each of the first and second interconnections 226 and 228 may be formed to have a multi-layered structure. That is, local interconnections may be formed on the interlayer dielectric layer 224 and then other interlayer dielectric layers may be additionally formed on the local interconnections, thereby forming global interconnections for connecting the local interconnections. The local interconnections and the global interconnections may be formed using a conventional multiple interconnections technology.

Although not illustrated in the drawings, the first interconnection 226 is connected to a ground terminal, and the second interconnection 228 is connected to a circuit terminal analogous to that shown in FIG. 5A. When an ESD voltage is applied to the second interconnection 228, the ESD protection device operates. If the ESD voltage is higher than a predetermined level, the extended portion G of the second interconnection 228 may form a channel formed between the n+ source 216 and the n+ drain 214 to discharge the ESD current to the ground terminal through the n+ source 216.

According to the present invention, an ESD current is discharged through a ground terminal by operation of both a lateral npn bipolar transistor and a vertical npn bipolar transistor, such that a current density of a weak substrate surface can be reduced. Since the current is discharged according to a bulk path of substrate spaced apart from the substrate surface, Joule heating generating from the substrate surface can be suppressed. In addition, an n-well and an n+ drain are connected together such that an impurity concentration of the n+ drain is increased by the impurities of the n-well. If a trigger voltage is low, ESD is effectively prevented and a stress of the ESD protection device can be reduced.

Moreover, the n-well connected to the drain may be formed while forming the well structure of the internal circuit only by changing a typical layout. Therefore, the existing process can be applied as it is because an additional process is not required. In addition, the present invention changes a well structure without increasing lateral dimensions, such that the ESD protection device can have improved intolerance without an increased area.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An electrostatic discharge protection device, comprising:
   a substrate;
   an n-well formed in the substrate;
   a p-well formed on the n-well;
   an NMOS transistor formed on the p-well, the NMOS transistor including a gate electrode, an n+ source and an n+ drain; and
   a grounded p+ well pick-up formed in the p-well,
   wherein the n-well is directly connected to the n+ drain of the NMOS transistor and the n+ source is grounded.

2. The device as claimed in claim 1, wherein the gate electrode is grounded.

3. The device as claimed in claim 1, wherein the gate electrode is electrically connected to the n+ drain.

4. The device as claimed in claim 1, wherein an impurity concentration of the n+ drain is higher than that of the n+ source.

5. The device as claimed in claim 1, wherein the n-well extends vertically under the n+ drain and contacts the n+ drain.

6. The device as claimed in claim 1, wherein the n-well extends vertically to form a junction with the p-well, and
   wherein a junction of the n-well and the p-well overlaps the n+ drain.

7. An electrostatic discharge protection device, comprising:
   a p-well region formed in a substrate;
   an NMOS transistor formed on the p-well region, the NMOS transistor including a gate electrode and an n+ source that are electrically connected to a ground terminal and an n+ drain electrically connected to a circuit terminal;
   a p+ well pick-up formed in the p-well region, electrically connected to the ground terminal; and
   an n-well formed under the p-well region, wherein the n-well extends vertically to contact the n+ drain of the NMOS transistor.

8. The device as claimed in claim 7, further comprising an interconnection connected to the ground terminal,
   wherein the n+ source, the gate electrode and the p+ well pick-up are connected to the interconnection in parallel.

9. The device as claimed in claim 7, wherein an impurity concentration of the n+ drain is higher than that of the n+ source.

10. An electrostatic discharge protection device connected to a circuit terminal and a ground terminal, comprising:
    a p-well region formed in a substrate;
    an NMOS transistor formed on the p-well region, the NMOS transistor including a gate electrode electrically connected to the circuit terminal, an n+ source electrically connected to the ground terminal and an n+ drain electrically connected to the circuit terminal;
    a p+ well pick-up formed in the p-well region to be electrically connected to the ground terminal; and
    an n-well formed under the p-well region, wherein the n-well extends vertically to contact the n+ drain of the NMOS transistor.

11. The device as claimed in claim 10, further comprising a first interconnection connected to the ground terminal,
    wherein the n+ source and the p+ well pick-up are connected to the first interconnection in parallel.

12. The device as claimed in claim 10, further comprising a second interconnection for connecting the circuit terminal and the n+ drain, wherein the gate electrode is an extended portion of the second interconnection.

13. The device as claimed in claim 10, wherein an impurity concentration of the n+ drain is higher than that of the n+ source.

* * * * *